AUTOMATIC GAIN CONTROL USING VOLTAGE DROP IN BIASING CIRCUIT COMMON TO PLURAL TRANSISTOR STAGES
Filed May 11, 1953
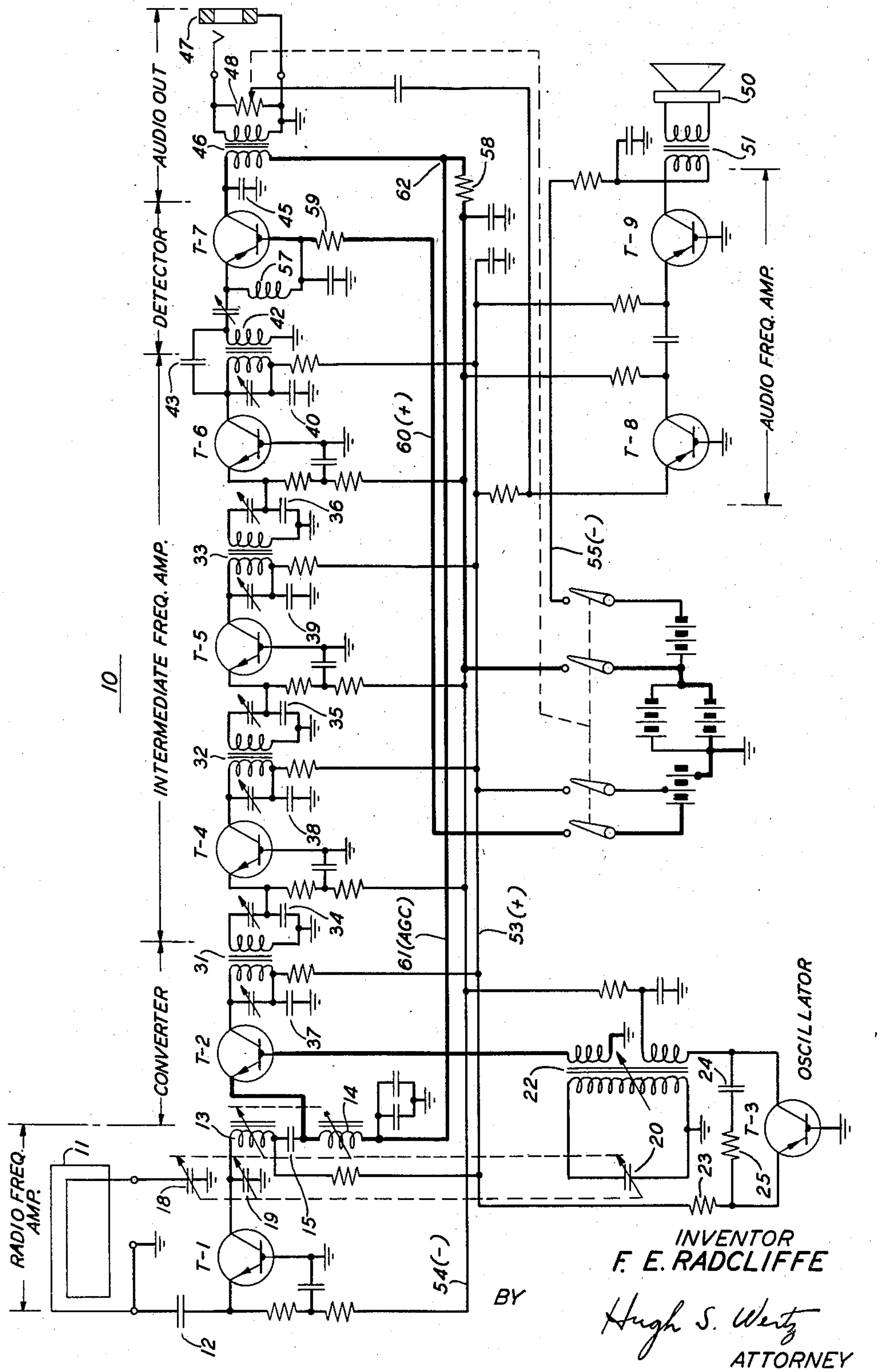
INVENTOR
F. E. RADCLIFFE
BY
Hugh S. Wertz
ATTORNEY United States Patent Office 2,885,544

Patented May 5, 1959

2,885,544

AUTOMATIC GAIN CONTROL USING VOLTAGE DROP IN BIASING CIRCUIT COMMON TO PLURAL TRANSISTOR STAGES

Frederick E. Radcliffe, Chatham, N.J., assignor to Bell Telephone Laboratories, Incorporated, New York, N.Y., a corporation of New York Application May 11, 1953, Serial No. 353,988

7 Claims. (Cl. 250—20)

This invention relates to transistor circuits.

The use of transistors as the active element in electronic equipment offers many advantages over vacuum tubes including compactness and low power consumption for notable example. However, the effective use of transistors in complex multistage electronic equipment requires the adjustment of signal levels, and it is in this area that transistor electronics has up to the present time lagged behind the general progress in the field.

Accordingly, an important object of the present invention is to control the gain of multistage transistor circuits automatically, using as few additions to the basic circuitry as possible.

In accordance with the invention, automatic gain control is obtained in a multistage transistor circuit by energizing the input of a transistor in an early amplification stage of the circuit and the output of a transistor in a later stage of the circuit from the same direct current biasing supply. As a specific illustration, the collector of the transistor in the second detector and the emitter of the converter of a transistor broadcast receiver may be biased by direct current from a common supply through a common resistance, so that when the detector draws more direct current at high signal levels, the emitter current bias will be reduced and the gain of the converter stage will be correspondingly decreased. Using a grounded base converter stage, the transistor used in the detector is advantageously of a different conductivity type than the transistor employed in the converter.

A feature of the invention is that no additional transistors are required to provide the amplification circuits with automatic gain control.

Other objects, features and advantages of the present transistor circuits will be developed in the course of the detailed description of the drawing, in which the single figure thereof is a circuit diagram of a multistage transistor circuit embodying automatic gain control in accordance with the invention.

Referring more particularly to the drawing, the circuit diagram shows, by way of example and for purposes of illustration, a complete transistor radio broadcast receiver 10 employing a transistor automatic gain control circuit. This automatic gain control circuit which will be described in greater detail hereinafter is shown in heavy lines in the drawing to contrast with the balance of the schematic.

Considering the circuit by stages, each component will be identified by the transistor included in the stage. The superheterodyne set is made up of a radio frequency amplification stage T–1, a converter T–2 which also yields considerable amplification, a local oscillator T–3, three intermediate frequency amplification stages T–4, T–5 and T–6, a detector T–7, and two audio amplification stages T–8 and T–9. The set is a portable radio, and was designed with a view to the practical problem of using currently available parts and components, which in many instances are better adapted to tube than to transistor circuitry.

Tracing the circuit through from antenna to speaker, the antenna 11 is the starting point. The loop antenna 11 is coupled through the bypass condenser 12 to the emitter of the junction transistor T–1. Incidentally, it may be noted that the junction transistors in the present circuit (T–1, T–2, T–4, T–5, and T–6) are indicated by emitter arrows pointing outwardly from the base while the point contact transistors (T–3, T–7, T–8, and T–9) are shown with the emitter arrows pointing inwardly, to indicate the direction of easy positive current flow. The transistor T–1 is arranged in its common base circuital configuration, and thus has a relatively low input impedance (200–300 ohms) at the emitter and a relatively high output impedance (about 50,000 ohms) at the reversely biased collector. A connection between the relatively large inductance 13 and a smaller inductance 14 in the tuned output circuit of the transistor T–1 in the radio frequency amplifier yields the low impedance output required to couple efficiently to the emitter of the converter transistor T–2. The bypass condenser 15 serves to isolate the biasing circuits for the two transistors. The variable condenser 19 in the output circuit of the radio frequency stage is ganged with condensers 18 and 20, to synchronize the tuning of the loop antenna and the local oscillator with the frequency adjustments of the tuned output circuit of the radio frequency amplifier.

The local oscillator employs a grounded base point contact transistor T–3 and utilizes a feedback network including bypass capacitor 24 and resistance 25, the magnitude of the resistance 25 determining the feedback of the oscillator. A relatively high resistance 23 serves to open the base to emitter circuit and increase the high frequency response of the oscillator. The step-up transformer 22 serves to match the output of the transistor T–3 to the high Q tuned circuit made up of the variable capacitor 20 and the secondary of the transformer 22. The third coil on the transformer 22 couples the output from the local oscillator to the base of the transistor T–2 in the converter stage. The radio frequency signal applied to the emitter is mixed with the local oscillator signal in this converter transistor T–2 to produce an intermediate frequency which may be the usual 455 kilocycle standard for broadcast receivers.

Standard radio interstage transformer coupling units 31, 32 and 33 are employed between the converter and intermediate frequency stages, and additional condensers 34, 35 and 36 are placed in series with the secondary tuning condensers to step the impedance level down to match that of the transistor emitters. The bypass condensers 37, 38, 39 and 40 keep the radio frequency energy out of the biasing circuits and thus prevent undesirable stray radiation and feedback.

The coupling between the last intermediate frequency stage and the second detector T–7 was through another standard transformer coupling unit 42, but the secondary and the tuning condenser are connected series resonant to the emitter of the transistor T–7. The original coupling provided by the transformer is maintained, and a small capacitance 43 is connected between primary and secondary. This interstage coupling circuit is much wider in bandwidth than the others but provides the necessary drive at the emitter of the detector.

The filtering capacitor 45 and the transformer 46 couple the audio output from the second detector T–7 to the output jack 47, and, through the variable resistance 48 to the conventional capacitance coupled stages of audio amplification T–8 and T–9. The permanent magnet speaker 50 is coupled to the last stage of amplification through the transformer 51.

The positive and negative biasing buses 53 and 54, respectively, supply the biasing voltages to the emitters and collectors of all the transistors except the converter T–2, the detector T–7 and the power amplifier T–9. The polarity of the connections for the junction transistors is reversed from that which is supplied to the point contact transistors, and suitable dropping resistances and bypass condensers are used throughout. In the case of the audio power amplification stage T–9, additional collector voltage is supplied through the line 55.

The important biasing circuits for the converter T–2 and the detector T–3 which provide the automatic gain control in accordance with the invention are shown in heavy lines in the drawing. To eliminate the conventional connections from our considerations, it may be noted in passing that the collector bias of the converter is connected to the biasing bus 53 in common with the other junction transistor collectors, and that the emitter of the transistor T–7 of the detector is at the same direct current potential as the base, as it is tied to it through the choke 57. The circuit biasing the collector of the detector in the high resistance direction runs from the negative voltage bus 54 through the resistance 58 and the primary of the transformer 46 to the collector; from the base the return path is through the resistance 59 to a positive voltage line 60 to obtain sufficient collector biasing voltage. The automatic gain control lead 61 carrying the emitter biasing current for the transistor T–2 is connected to the collector biasing circuit of the detector at point 62 between the resistance 58 and the collector. It may thus be seen that the emitter of the N–P–N transistor T–2 is biased in the forward direction in such a manner that it is very sensitive to slight changes in current through the resistance 58 which is common to the two biasing circuits.

In the operation of the automatic gain control circuit in accordance with the invention, the current divides at point 62 with a portion of the current biasing the emitter of transistor T–2 and the balance passing through the collector of the transistor T–7, when no signal is present at the emitter of the detector T–7. As more and more input signal is applied to the receiver, the transistor T–7 draws more collector current so that the current available at the emitter of the converter is substantially reduced, and the gain of the stage is correspondingly cut down.

Because of the relatively high current requirements for the input biasing circuits of transistors it is impractical to control the emitters of more than one transistor in a manner analogous with vacuum tube receiver practice in which the grids of a plurality of tube amplification stages are controlled in parallel. To control the gain of more than one transistor amplification stage, without the use of additional current amplification circuitry, would require that the detector carry a current equal to its no signal current plus the emitter currents of all the controlled transistors.

A broadcast receiver has actually been constructed as illustrated in the circuit diagram and successful operation was obtained. The following circuital constants and operating conditions for the automatic gain control circuit are given as illustrative of one possible mode of operation and are not to be construed as a limitation of the invention. A voltage source of —22.5 volts was connected to the collector of the detector T–7 by way of the 8200 ohm resistance 58. A positive potential of +19.5 volts was applied to the base of the transistor T–7 through the 100 ohm resistance 59. With no signal voltage at the input of the transistor T–7 the current divides at point 62 with 1.1 ma. passing through the emitter of the converter transistor T–2 and 1.6 ma. biasing the collector of the detector transistor T–7. To illustrate the impracticality of controlling more than one amplification stage with a single transistor, it may be noted that the collector of the detector carries 2.7 ma. when the emitter current of the converter is reduced to zero, and that the overload current of this collector circuit is 2.8 ma.

Several advantages result from the use of the converter as the gain control stage. Initially, because it operates at a low level portion of the circuit, crosstalk effects are minimized. In addition, the difference between input and output frequencies in the converter-amplifier stage prevents coupling directly from the radio frequency stage to the intermediate frequency stages which might otherwise bypass the gain control stage particularly at high signal input levels.

Another feature which distinguishes the present circuits from conventional vacuum tube circuits is the use of different types of transistors so that the same polarity of bias is required at the input of the converter and the output of the detector stages. While the automatic gain control circuits shown are particularly advantageous for grounded base configurations, the present invention is not limited to circuits in which transistors of different conductivities are used or to the so-called grounded or common base circuits. In regard to another distinguishing matter, the use of collector voltage sources for the detector which are positive and negative with respect to the grounded base of the converter is an important factor in the operation of the present automatic gain control circuit.

It is to be understood that the above-described arrangements are illustrative of the application of the principles of the invention. Numerous other arrangements may be devised by those skilled in the art without departing from the spirit and scope of the invention.

What is claimed is:

1. In an automatic gain control circuit for a multistage transistor circuit, an amplifying stage including a first transistor of one conductivity type, a second transistor of the other conductivity type whereby the input circuit of said first transistor requires the same polarity of current bias as the output circuit of said second transistor, circuit means for biasing said second transistor to a non-linear portion of its characteristic so that its output circuit will draw more biasing current at larger values of signal voltage, and a common current supply coupled to the input biasing circuit of said first transistor and the output biasing circuit of said second transistor, said common current supply including sufficient impedance so that the increased output direct current drawn by said second transistor at high signal levels will reduce the biasing current at the input of said first transistor and reduce the gain of said amplifying stage.

2. In an automatic gain control circuit for a multistage transistor circuit, an amplifying stage including a first transistor of one conductivity type having an input biasing circuit, a second transistor of the other conductivity type coupled to receive signals from said amplifying stage and having an output biasing circuit utilizing the same polarity of current bias as the input circuit of said first transistor, and a common limited current supply coupled to the input biasing circuit of said first transistor and the output biasing circuit of said second transistor, whereby the amplification of said first transistor is a function of the current drawn by said second transistor.

3. In an automatic gain control circuit for a multistage transistor circuit, an amplifying stage including a first transistor of one conductivity type, a second transistor of the other conductivity type, an alternating current circuit coupling the output of said first transistor and the input of said second transistor, a direct current connection between the input biasing circuit of said first transistor and the output biasing circuit of said second transistor, a voltage source, a resistive circuit coupling said voltage source to said direct current circuit, and means for reducing the alternating current feedback of said direct current circuit.

4. An automatic gain control circuit as set forth in claim 3 in which an alternating current load is coupled to the output of said second transistor.

5. In combination, a source of modulated signals, an amplifying stage for said modulated signals including a first transistor of one conductivity type, a detector for said signals including a transistor of another conductivity type, and a common current supply coupled to the input biasing circuit of said first transistor and the output biasing circuit of said second transistor.

6. In combination, a multistage transistor circuit having first and second transistors, means for operating said second transistor in a non-linear portion of its characteristic, circuital means for coupling the signal output of said first transistor to the input of said second transistor, and means for applying a voltage to the emitter-to-base portion of said first transistor in the low resistance direction, said last-mentioned means including a voltage source coupled through a resistive network to the input biasing circuit of said first transistor and the output biasing circuit of said second transistor.

7. A transistor radio receiver comprising at least one transistor radio frequency amplification stage, a transistor converter coupled to said radio frequency amplification stage, said converter including a transistor having a base-emitter input biasing circuit, at least one transistor intermediate frequency amplification stage coupled to the output of said converter, a transistor detection stage coupled to said intermediate frequency amplification stage, a voltage source, a resistive element, a series circuit including said voltage source, said resistive element and the output circuit of the transistor in said detection stage, and circuit means connecting said input biasing circuit to said series circuit between said resistive element and the transistor in said detection stage to bias said input base-emitter circuit in the low resistance direction whereby the amplification of said converter stage is a function of the current drawn by the transistor in said detection stage.

References Cited in the file of this patent

UNITED STATES PATENTS

| | | |
|---|---|---|
| 1,879,861 | Wheeler | Sept. 27, 1932 |
| 2,046,144 | Anders | June 30, 1936 |
| 2,206,181 | Gilbert | July 2, 1940 |
| 2,207,905 | Weagant | July 16, 1940 |
| 2,243,423 | Hollingsworth | May 27, 1941 |
| 2,620,448 | Wallace | Dec. 2, 1952 |
| 2,647,957 | Mallinckrodt | Aug. 4, 1953 |
| 2,744,198 | Raisbeck | May 1, 1956 |